(12) United States Patent
Jurneke

(10) Patent No.: US 8,046,380 B2
(45) Date of Patent: Oct. 25, 2011

(54) DATA STORAGE SYSTEM

(75) Inventor: Joe Kent Jurneke, Brighton, CO (US)

(73) Assignee: Quantum Corporation, San Jose, CA (US)

( * ) Notice: Subject to any disclaimer, the term of this patent is extended or adjusted under 35 U.S.C. 154(b) by 609 days.

(21) Appl. No.: 12/099,707

(22) Filed: Apr. 8, 2008

(65) Prior Publication Data

US 2009/0254791 A1    Oct. 8, 2009

(51) Int. Cl.
*G06F 7/00* (2006.01)
*G06F 17/30* (2006.01)
(52) U.S. Cl. .................. 707/795; 707/812; 714/777
(58) Field of Classification Search .......... 707/600–831; 711/102–104, 114, 156, 161, 162; 714/6, 714/11, 48, 49, 52–54, 57, 701, 703, 746, 714/751–754, 758, 764, 768, 798, 777; 726/27
See application file for complete search history.

(56) References Cited

U.S. PATENT DOCUMENTS

| | | | | |
|---|---|---|---|---|
| 6,684,310 | B2 * | 1/2004 | Anzai et al. | 711/164 |
| 6,785,786 | B1 * | 8/2004 | Gold et al. | 711/162 |
| 7,143,305 | B2 * | 11/2006 | Hajji et al. | 714/2 |
| 7,185,031 | B2 * | 2/2007 | Rand | 1/1 |
| 7,334,098 | B1 * | 2/2008 | Poston | 711/162 |
| 2006/0059322 | A1 * | 3/2006 | Poston | 711/162 |
| 2008/0162797 | A1 * | 7/2008 | Teicher et al. | 711/103 |

OTHER PUBLICATIONS

Dolgunov, Enabling Optimal Security for Removable Storage Devices, Nov. 27, 2007, IEEE, 15-21.*

* cited by examiner

*Primary Examiner* — Jean B Fleurantin
(74) *Attorney, Agent, or Firm* — Baker Botts L.L.P.

(57) ABSTRACT

The present invention is directed to an archival data storage system. The archival data storage system includes write once and read many (WORM) capability, data redundancy, error correction, and access control. The combination of these capabilities enable the archival storage system to be secure, error proof, and reliable. Additionally, to provide fast data access time, solid state storage devices are used in place of conventional tape drive. Solid state storage devices such as, for example, flash memory devices are fast, versatile and reliable.

15 Claims, 5 Drawing Sheets

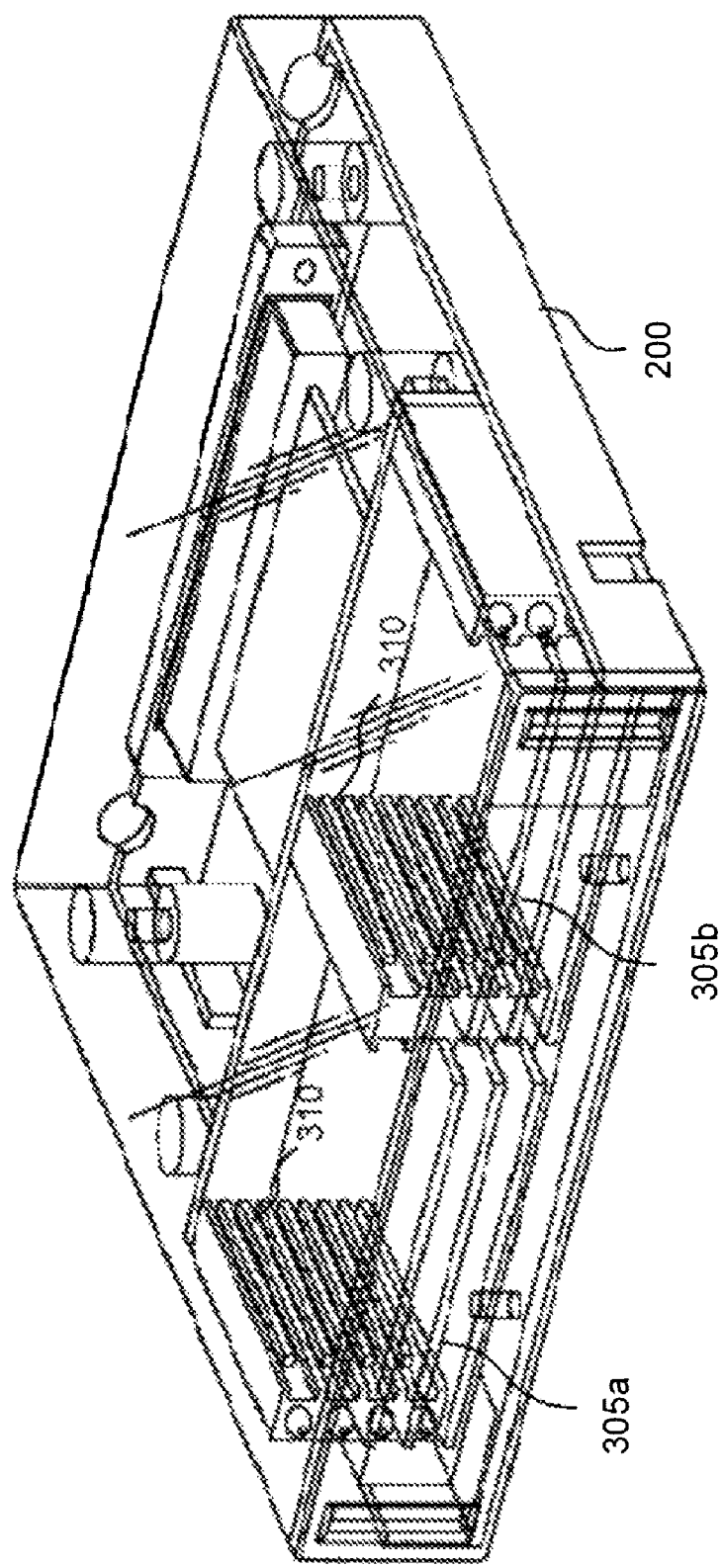
FIG. 3 A (isometric front view)

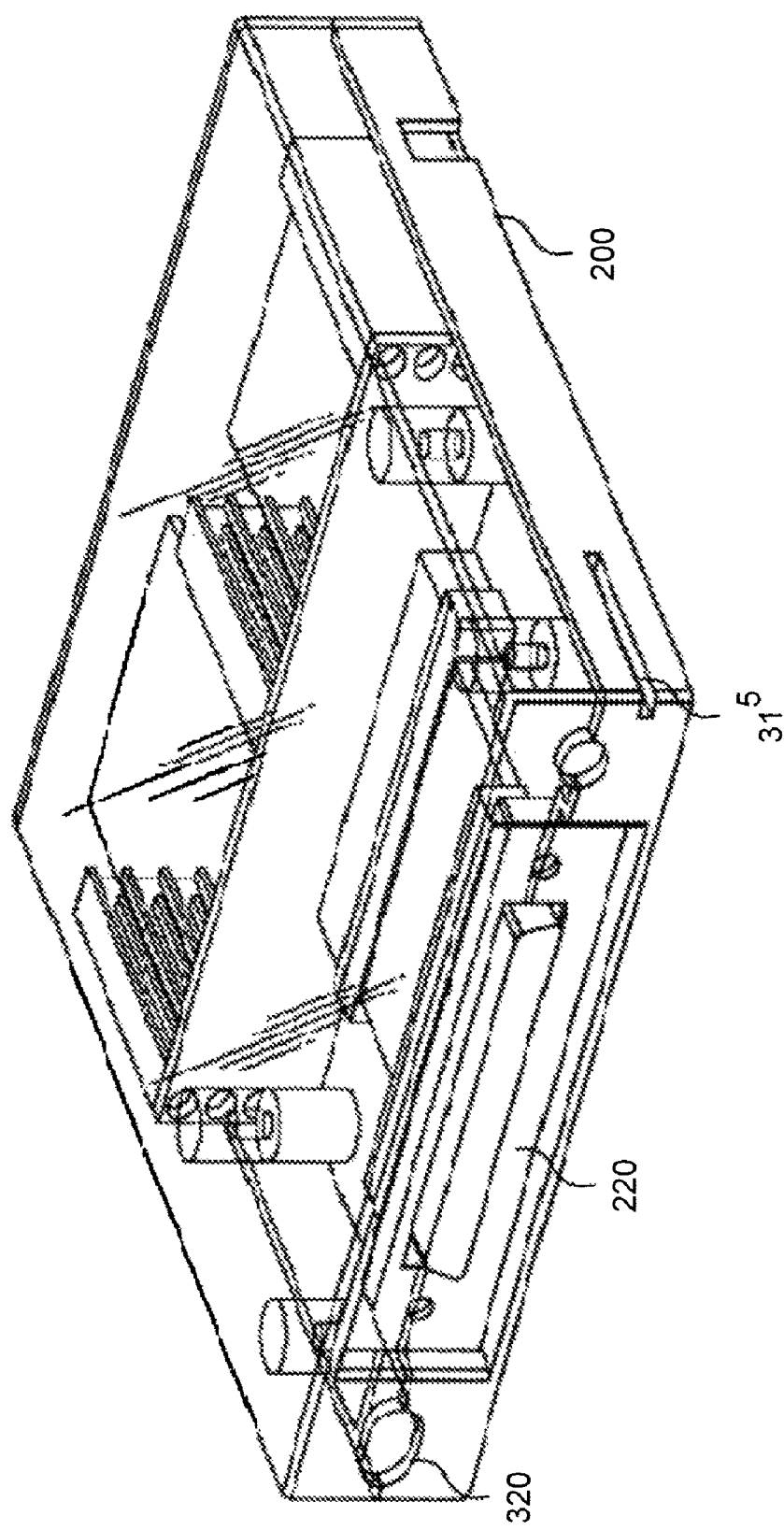
FIG. 3B (isometric rear view)

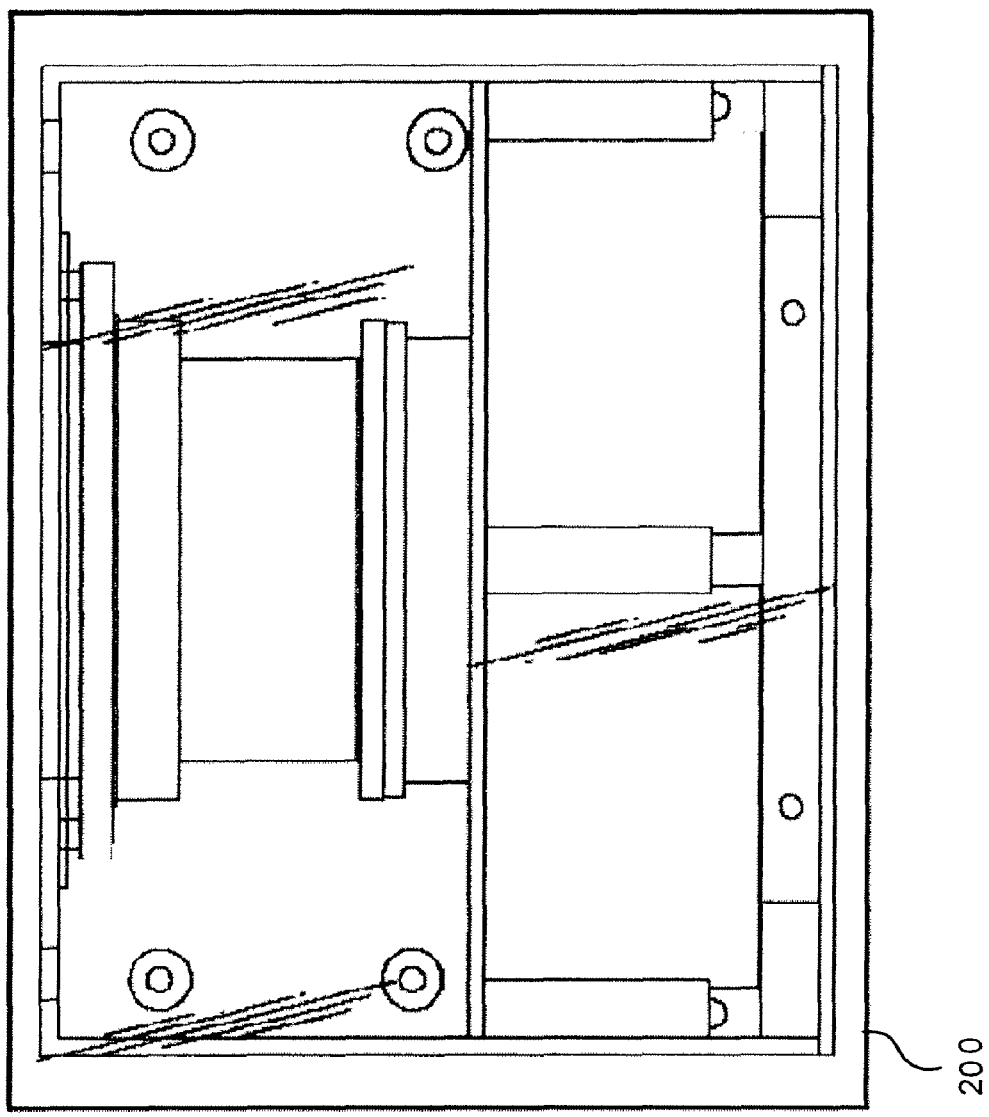
FIG. 3C (top view)

DATA STORAGE SYSTEM

TECHNICAL FIELD

The present invention relates to a data storage system and more particularly, some embodiments relate to a redundant data storage system with built in error correction and write restriction.

DESCRIPTION OF THE RELATED ART

Vast amounts of electronic data are stored, communicated, and manipulated by modern computer systems. Some of those data need to be archived and stored for an extended period of time. Conventional long-term archival system uses tape storage devices or other form of magnetic storage devices such as magnetic disk drive.

Data stored on magnetic medium such as tape and/or disk drives can become corrupted over time. When this happens, it is difficult or even impossible to reconstruct lost data in a conventional archival system. Additionally, data can become corrupted because the medium itself is changing with time. In conventional archival system, there is no means to detect data corruption and a degraded storage medium. Accordingly, there is a desire for an archival system that addresses one or more of the above identified problems.

BRIEF SUMMARY OF EMBODIMENTS OF THE INVENTION

The present invention relates to data storage and more particularly, some embodiments relate to a redundant data storage system. In one embodiment, the data storage system includes: an interface configured to communicate with an external device; a plurality of storage devices coupled to the interface; a write once read many (WORM) module configured to allow data to be written into one or more of the plurality of storage devices by an external device while prohibiting the external device from altering the previously written data; an error correction module configured to generate error correction code for data received from the external device, wherein the error correction code is stored along with the received data and is used to correct the data if the data is corrupted upon retrieving the data; and a RAID controller configured to generate and distribute parity data in one or more of the plurality of storage devices.

In another embodiment, the data storage system includes a data compression module configured to compress data received from the external device prior to storing the received data. The data storage system may include a security module configured to restrict access to data stored in the plurality of storage devices and may also include a RAID controller. The RAID controller can be configured to implement various RAID mode such as, for example, RAID 3 or RAID 5.

In still another embodiment, the plurality of storage devices comprise flash memory devices, and the interface may comprise a USB interface, an Ethernet interface, a FC interface, a SCSI interface, or a wireless interface. The interface can also be wireless. The plurality of storage devices may also comprise eight storage devices.

In still another embodiment, the data storage device includes a plurality of status indicators configured to display an operating status of one or more of the plurality of storage devices. The data storage device may also include a data maintenance module configured to reconstruct any lost or corrupted data on any of the plurality of storage devices.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

FIGS. 3A-C illustrate various views of the storage module shown in FIG. 2 according to one embodiment of the present invention.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward an archival data storage system with write once and read many (WORM) capability, data redundancy, error correction, and access control.

Figure 1:
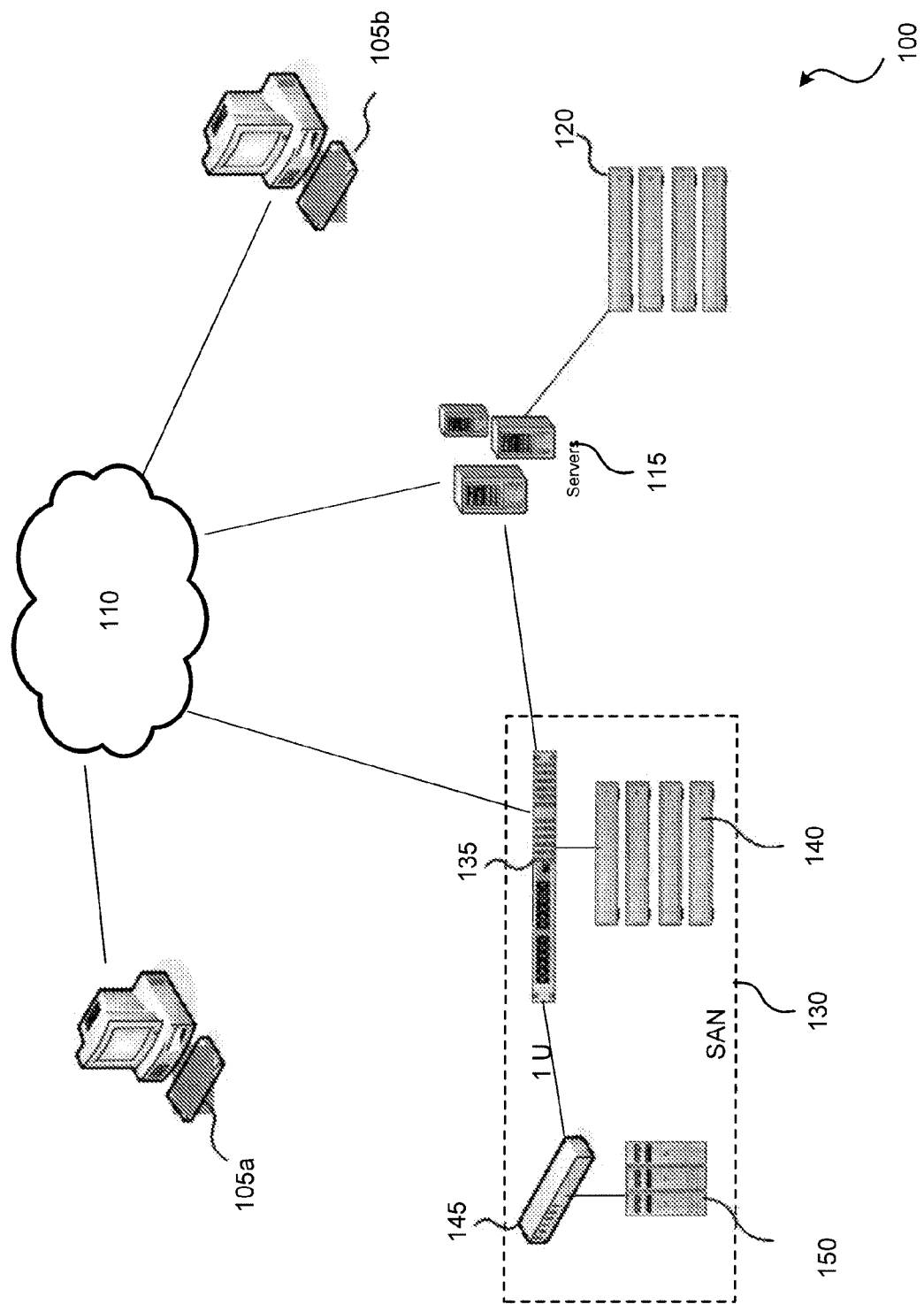
FIG. 1 illustrates an example environment in which the invention can be implemented according to one embodiment of the present invention.

Before describing the invention in detail, it is useful to describe an example environment with which the invention can be implemented. FIG. 1 illustrates a data storage system 100 with which the present invention can be implemented. System 100 in the illustrated example includes computing devices 105a-b, a network 110, a server 115, an array of storage disk 120, and a storage area network 130. Computing devices 105a-b can any of a variety of computing devices including, for example, laptops, desktops, workstations, personal digital assistants (PDAs), handheld computing devices, or other types of computing devices in all classes of storage from low end through enterprise class devices.

Network 110 can be implemented using any of a variety of network architectures or topologies. Such networks might include, for example, the internet, a local area network (LAN), a wide area network (WAN), a plain old telephone system (POTS), or any other suitable network or communications channel. As shown, computing devices 105a-b and server 115 are connected to network 110. The connection to network 110 can be wireless or through a wired connection.

Server 115 can be any server system such as, for example, a conventional standalone file server configured to provide data services to a client device such as device 105a. Server 115 can be scalable to increase storage capacity such as, for example, by adding storage disk array 120. Disk array 120 can be implemented as, for example, a direct-attached storage (DAS system). In the example architecture illustrated in FIG. 1, system 100 includes SAN 130, which includes switch 135, disk array 140, router 145, and a tape server 150. Server 115, disk array 120, and SAN 130 can be implemented using one or more types of storage architectures such as, for example, small computer system interface (SCSI), serial advanced technology attachment (SATA), serial attached SCSI (SAS), or fiber channel (FC). Configurations can be expanded to include mainframe, enterprise class devices as well.

Generally, a legacy SCSI system with an 8-bit wide bus can typically deliver data at a rate of approximately 40 megabytes per second (MBps), whereas contemporary 16-bit wide bus SCSI systems can deliver data up to 320 MBps. Typical SATA systems are generally less expensive than an equivalent SCSI system and can provide performance close to that of the 16-bit wide bus SCSI system at 300 MBps.

FC systems are common and more widely used than SATA and SCSI systems. FC systems offer several advantages such as pooled resources, flexible backup capability, scalability, fast data transfer (up to 800 MBps full-duplex 4 Gbit link), and the ability to accommodate long cable lengths. FC systems may have cable lengths up to 10 kilometers as compared to a maximum cable length of 25 meters for other system such as, for example, a SCSI system.

With continued reference to FIG. 1, the illustrated exemplary system 100 can provide data access and storage redundancy by storing data at multiple locations such as server 115, disk arrays 120 and 140, or tape server 150. Server 115 can be groups of remote servers, each group may be locally or remotely connected with other groups via a network similar to network 110. As shown in FIG. 1, server 115 may access data or backup data to disk array 140 or tape server 150 through network 110 or via a direct connection to switch 135. In this way, server 115 has the flexibility of accessing array 140 or tape server 150 via multiple connections and thereby avoids network bottlenecks.

In one embodiment, switch 135 is an FC data switch and tape server 150 is SCSI type server. In this embodiment, router 145 is configured to transfer data between a FC data bus of FC switch 135 and a SCSI bus of SCSI tape server 150. Although a specific architecture is described above, components of SAN 130 may have a different architecture or combination of architectures such as, for example, SATA, SAS, and FC.

In system 100, data redundancy can be implemented in SAN 130 by implementing RAID across disk array 140. Parity data required for reconstructing a failed data sector can be distributed by a RAID controller (not shown) located in SAN 130, across array 140, or separately to tape server 150, or across both array 140 and tape server 150. In this setup, clients 105a-b typically can not access data stored within SAN 130 network when a critical component (e.g., motherboard, switch 135, power supply, etc.) of node 130 fails.

From time to time, the present invention is described herein in terms of this example environment. Description in terms of this environment is provided to allow the various features and embodiments of the invention to be portrayed in the context of an exemplary application. After reading this description, it will become apparent to one of ordinary skill in the art how the invention can be implemented in different and alternative environments.

Figure 2:
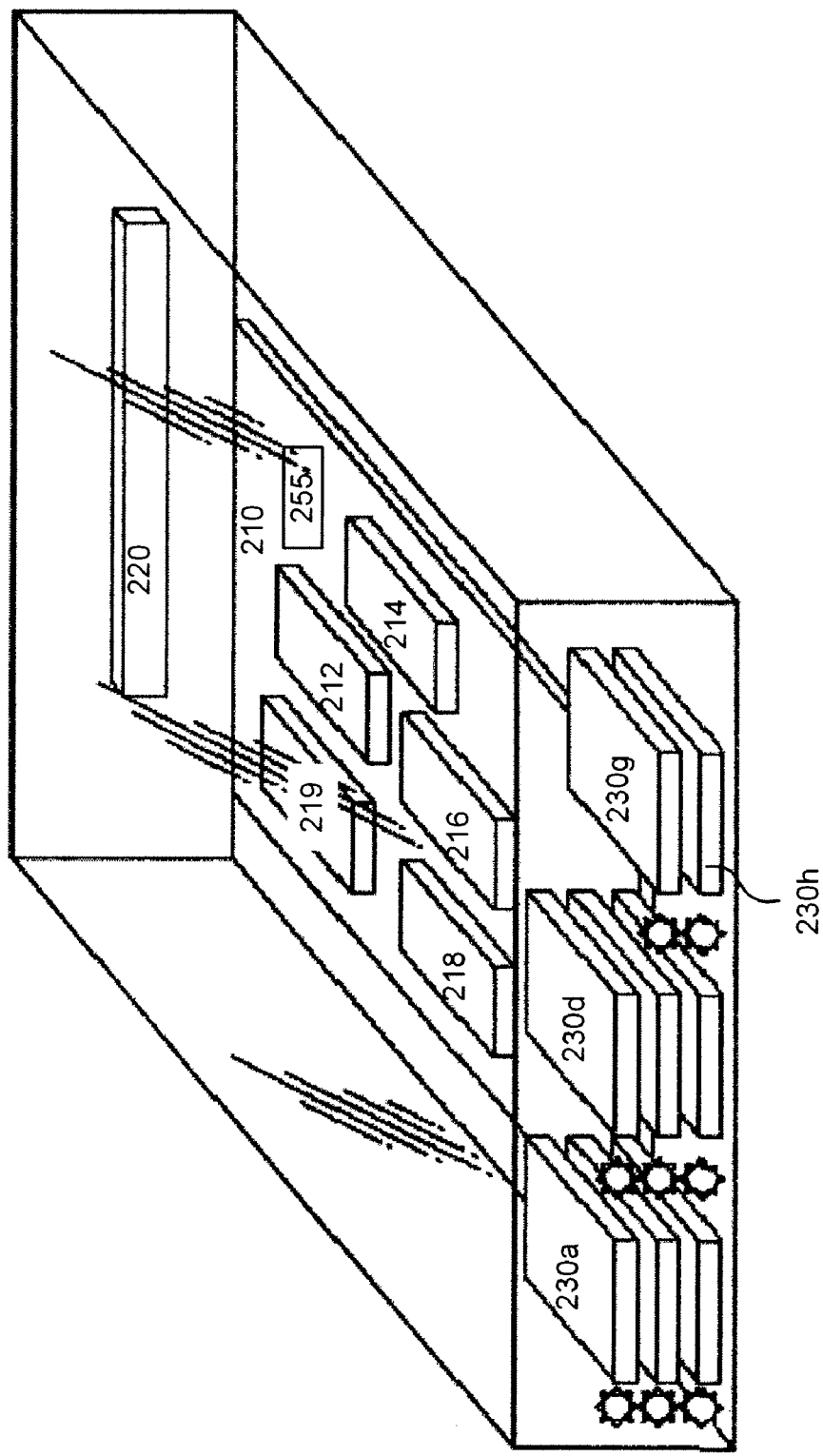
FIG. 2 illustrates an example storage module according to one embodiment of the present invention.

FIG. 2 illustrates a storage module 200 according to one embodiment of the present invention. In an example application, storage module 200 may be implemented in tape server 150 to store data. Referring now to FIG. 2, storage module 200 includes a motherboard 210, an input/output (I/O) interface 220, a plurality of storage devices 230a-230h, and plurality of indicators 235. In the example shown in FIG. 2, motherboard 200 includes a write once read many (WORM) engine 212, a diagnostic and error recovery module 214, a redundant array of independent disks (RAID) controller 216, a data compression module 218, and an encryption engine and key management module 219.

I/O interface 220 comprises one or more interfaces such as, for example, universal serial bus (USB), SCSI, FC, Ethernet, parallel interface, wireless, and other suitable interface. In one embodiment, I/O interface 220 comprises a USB port, an Ethernet interface, and an FC interface. The Ethernet interface may include a wire interface such as a RJ-45 interface or a wireless interface that implements a wireless communication standard such as EEE 802.xx, HomeRF, or other suitable wireless standard.

WORM engine 212 allows external devices access to data stored in storage devices 230a-h via I/O interface 220. In one embodiment, WORM engine 212 is configured to allow an external device to write a particular data set to the storage modules only once. WORM engine 212 prohibits data rewriting to prevent data tampering of data already stored in memory devices 230. This may be done using electronic keys or other means. An example of a WORM medium is CD-ROM, DVD-R, programmable read-only memory (PROM), field programmable read-only memory (FPROM). These mediums are WORM mediums as they only allow a user to write data but not to rewrite data that have already been written on the medium. Memory devices 230 may comprise one or more of these WORM mediums. In one embodiment, memory devices 230 comprise re-writeable memory devices such as, for example, a magnetic disk drive, an erasable programmable read-only memory (EPROM), an electrically erasable programmable read-only memory (EEPROM), a NOR-type flash memory, and a NAND-type flash memory. In this embodiment, the WORM functionality can be implemented using electronic keys or other data write restriction method. In this way, re-writeable memory devices can be implemented as WORM devices.

Generally, in a magnetic disk, data may be erased or re-written by changing or rewriting the magnetic signature on the magnetic medium. In an EPROM, data may be erased by exposing the EPROM to ultraviolet (UV) light. This type of EPROM typically has a transparent window on top to allow UV light to pass. An EPROM is not considered to be a flash memory since its data cannot be erased electronically. However, data of an EEPROM or a flash memory can be erased electrically using an electric field. The term flash memory, as used herein, refers to various types of non-volatile memory that can be erased electronically such as, for example, an EEPROM, a NOR-type flash memory and a NAND-type flash memory. Memory devices 230 may comprise one or both the NOR-type and NAND-type flash memory devices.

In one embodiment, memory devices 230 comprise flash memory devices such as an EEPROM memory devices. Flash memory devices have fast data access time. Unlike a magnetic disk drive, flash memory devices do not require startup time to get the disk to spin at a certain speed. Additionally, flash memory devices are versatile because they have no moving mechanical components such as the mechanical arm that supports the read head in a magnetic drive motors and so on. As such, flash memory devices have very fast data read and write time as compared to a magnetic disk drive.

As mentioned, storage module 200 also includes diagnostic and error recovery module 214. In one embodiment, module 214 is configured to perform error code correction (ECC) on data being read from memory devices 230 during a read operation. Module 214 is also configured to generate ECC codes for incoming data blocks and to append the generated ECC codes onto the end of the incoming data blocks. During a read operation of a data block, module 214 checks the data stored in the body of the data block against the ECC code stored at the end of the data block. From this comparison, module 214 may determine whether there is an error in the data block and to correct the data if an error is found. Although ECC is described, other error detection and correction method could also be employed by recovery module 214 such as, for example, forward error correction (FEC).

RAID controller 216 is configured to implement RAID across storage devices 230. In this way, data redundancy is achieved. In one embodiment, RAID controller 216 is configured to implement RAID 5 across storage devices 230. In a RAID 5 system, parity data is generated and stored across storage devices 230. In this way, each storage unit of storage devices 230a-g contains parity data used to reconstruct damaged or lost data where necessary. Alternatively, RAID controller 216 can be configured to implement RAID 3. In a RAID 3 system, parity data for all of the data stored in storage devices 230a-h are stored on a single storage unit, which can be one of the storage devices 230a-h. Implementation of RAID 3 and 5 are for illustrative purposes only. It should be apparent to one skilled in the art that various RAID configurations (e.g. RAID 2 and RAID 10) can be implemented by RAID controller 216.

In motherboard 210, data compression module 218 is configured to compress incoming data prior to storing the incoming data in storage devices 230. Data compression module 218 can be configured to compress incoming data using software means, hardware means, or a combination of both. Various data compression algorithms can be implemented by compression module 218 such as, for example, linear predictive coding, entropy coding, Burrows-Wheeler transform, discrete cosine transform, or other suitable data compression techniques.

Encryption engine and key management module 219 is configured to restrict access to storage module 200. Before data can be write to or read from memory devices 230, the client system or user has to first authenticate itself to module 219. In this way, data stored in storage module 230 may remain secured.

As shown in FIG. 2, storage module 200 includes eight data storage devices 230a-h and eight status indicators 235a-h. Each status indicator is configured to display the operating status of an associated storage device. Although storage module 200 is shown to have eight storage devices and status indicators, a different amount of storage devices and indicators could be implemented. In one embodiment, status indicator is configured to turn red or blink or provide some indication whenever its associated storage device should to be replaced. Whenever a storage device is out of service and should to be replaced, a data reconstruction and migration (data maintenance) module 255 may work with RAID controller 216 to reconstruct data stored in the out of service storage device. Alternatively, RAID controller 216 can be configured to perform this task alone. Once the out of service storage device is replaced, RAID controller 216 or data maintenance module can migrate data and RAID parity data back to the newly replaced disk.

FIG. 3A illustrates an example structural design of storage module 200 according to one embodiment of the present invention. FIG. 3A is an isometric view from a front angle of storage module 200. Referring now to FIG. 3A, storage module 200 includes storage device rack areas 305a and 305b and guide 310. Each of the rack areas includes guide rails 310 to help guide the installation of a storage device. The physical dimensions of storage module 200 and rack areas 305a-b are chosen such the storage device can be easily installed by a human user or a robotic arm. Further, the physical dimension of storage module 200 is approximately the same as a standard tape cartridge. In this way, storage module 200 can be used with current automated archival system.

Guide 313 is configured to prevent improper installation of storage module 200. Guide 313 prevents an upside down installation of storage module 200 into a rack of a server or an archival system. Additionally, guide 313 may serve as a locking device to hold storage module 200 in place once it is installed into a server or an archival system.

FIG. 3B illustrates an example structural design of storage module 200 according to one embodiment of the present invention. FIG. 3B is an isometric view from a rear angle of storage module 200. Referring now to FIG. 3B, storage module 200 includes a guiding slot 315 and mating hole 320. Slot 315 and hole 320 are used to ensure that storage module 200 properly matches with a backplane (not shown) or interface of a rack of a server or an archival system. Once storage module 200 is properly installed, interface 220 will be able to communicate with the host server or archival system. As shown in FIG. 3B, interface 220 comprises a parallel interface. It should be noted that other type of interfaces could be used such as, for example, USB, SCSI, FC, and Ethernet. FIG. 3C illustrate a top view of storage module 200.

Unless defined otherwise, all technical and scientific terms used herein have the same meaning as is commonly understood by one of ordinary skill in the art to which this invention belongs. All patents, applications, published applications and other publications referred to herein are incorporated by reference in their entirety. If a definition set forth in this section is contrary to or otherwise inconsistent with a definition set forth in applications, published applications and other publications that are herein incorporated by reference, the definition set forth in this section prevails over the definition that is incorporated herein by reference.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "cat least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A data storage system comprising:
   an interface configured to communicate with an external device;
   a plurality of storage devices coupled to the interface;
   a write once read many (WORM) module configured to allow data to be written into one or more of the plurality of storage devices by an external device while prohibiting the external device from altering the previously written data;
   an error correction module configured to generate error correction code for data received from the external device, wherein the error correction code is stored along with the received data and is used to correct the data if the data is corrupted upon retrieving the data;
   a RAID controller configured to generate and distribute parity data in one or more of the plurality of storage devices, the parity data associated with the data received from the external;
   a data compression module configured to compress data received from the external device prior to storing the received data in the one or more of the plurality of storage devices; and
   a security module configured to restrict access to data stored in the plurality of storage devices, such data including the previously written data.

2. The data storage of claim 1, wherein the RAID controller comprises a RAID 5 controller.

3. The data storage of claim 1, wherein the plurality of storage devices comprise flash memory devices.

4. The data storage of claim 1, wherein the interface comprises a USB interface, an Ethernet interface, a FC interface, a SCSI interface, or a wireless interface.

5. The data storage of claim 1, wherein the interface is wireless.

6. The data storage of claim 1, wherein the plurality of storage devices comprise eight storage devices.

7. The data storage of claim 1, further comprising a plurality of status indicators configured to display an operating status of one or more of the plurality of storage devices.

8. The data storage of claim 1, further comprising a data maintenance module configured to reconstruct any lost or corrupted data on any of the plurality of storage devices.

9. An archival system comprising:
  a plurality of storage devices; a write once read many (WORM) module configured to allow data to be written into one or more of the plurality of storage devices by an external device while prohibiting the external device from altering the previously written data;
  a RAID controller configured to generate and distribute parity data in one or more of the plurality of storage devices, the parity data associated with the data received from the external device;
  an error correction module configured to generate error correction code for data received from the external device, wherein the error correction code is stored along with the received data and is used to correct the data if the data is corrupted upon retrieving the data;
  a data maintenance module configured to reconstruct any lost or corrupted data on any of the plurality of storage devices;
  a data compression module configured to compress data received from the external device prior to storing the received data in the one or more of the plurality of storage devices; and
  a security module configured to restrict access to data stored in the plurality of storage devices, such data including the previously written data.

10. The archival system of claim 9, wherein the RAID controller is configured to implement RAID 5.

11. The archival system of claim 9, wherein the plurality of storage devices comprise flash memory devices.

12. The archival system of claim 9, wherein the interface comprises a USB interface, an Ethernet interface, a FC interface, a SCSI interface, or a wireless interface.

13. The archival system of claim 9, wherein the plurality of storage devices comprise eight storage devices.

14. The archival system of claim 9, further comprising a plurality of status indicators configured to display an operating status of one or more of the plurality of storage devices.

15. The archival system of claim 9, further comprising a data maintenance module configured to reconstruct any lost or corrupted data on any of the plurality of storage devices.

* * * * *